United States Patent
Sugawara

(10) Patent No.: US 6,917,699 B2
(45) Date of Patent: Jul. 12, 2005

(54) IMAGE PROCESSING METHOD, AN IMAGE PROCESSING DEVICE AND A BONDING APPARATUS

(75) Inventor: Kenji Sugawara, Kokubunji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 625 days.

(21) Appl. No.: 10/125,755

(22) Filed: Apr. 18, 2002

(65) Prior Publication Data

US 2002/0166885 A1 Nov. 14, 2002

(30) Foreign Application Priority Data

Apr. 20, 2001 (JP) ........................................ 2001-121940

(51) Int. Cl.$^7$ ................................................ G06K 9/00

(52) U.S. Cl. ...................... 382/151; 382/146; 382/147; 382/149

(58) Field of Search ................................. 382/141–143, 382/151, 224, 287; 348/86, 87, 125, 126; 29/833; 438/16; 700/95, 96, 110

(56) References Cited

U.S. PATENT DOCUMENTS 6,259,960 B1 * 7/2001 Inokuchi ...................... 700/110
6,751,361 B1 * 6/2004 Wagman ...................... 382/287
6,842,538 B2 * 1/2005 Lee et al. .................... 382/224

* cited by examiner

Primary Examiner—Vikkram Bali
(74) Attorney, Agent, or Firm—Koda & Androlia

(57) ABSTRACT

So as to perform high-precision position detection without performing pattern matching in the direction of rotation even when the object of detection involves a positional deviation in the direction of rotation, pattern matching between a reference image and a rotated image obtained by rotating this reference image is performed during registration, and then the difference between the measured value of the position obtained following rotation and the theoretical value of the position of the rotated image is retained as a calibration amount corresponding to the known angle of rotation. Upon detection, the measured value is detected by pattern matching between an image of the object of detection, which is detected by imaging the object of detection disposed in an attitude that includes a positional deviation in the direction of rotation, and a reference image; and this measured value is corrected by the calibration amount.

8 Claims, 14 Drawing Sheets

| LUT2 | ANGLE OF ROTATION | DIFFERENCE VALUE ΔX2 | DIFFERENCE VALUE ΔY2 |
|---|---|---|---|

| LUT1 ANGLE OF ROTATION | DIFFERENCE VALUE ΔX1 | DIFFERENCE VALUE ΔY1 |
|---|---|---|
| +5Q | ... | ... |
| +4Q | ... | ... |
| +3Q | ... | ... |
| +2Q | ... | ... |
| +1Q | ... | ... |
| 0 | 0 | 0 |
| −1Q | ... | ... |
| −2Q | ... | ... |
| −3Q | ... | ... |
| −4Q | ... | ... |
| −5Q | ... | ... |

IMAGE PROCESSING METHOD, AN IMAGE PROCESSING DEVICE AND A BONDING APPARATUS

BACKGROUND OF THE INVENTION

1. Field of the Invention

The present invention relates to an image processing method, an image processing device and a bonding apparatus that includes such an image processing device and more particularly to a method and device that detects the position of an object of detection by way of performing pattern matching of the object of detection and a reference image.

2. Prior Art

In image processing techniques, a pattern matching is widely used. The pattern matching generally uses a portion of a reference image (constituting a known image) as a template image in order to detect the position of an object of detection by detecting the position of this known image contained in the image of the object of detection.

A position detection method that uses such pattern matching will be described with reference to a wire bonding apparatus, which is a semiconductor assembly apparatus, as an example.

In a wire bonding apparatus, wires, typically metal wires, are bonded so that bonding pads consisting of, for instance, aluminum on the surfaces of semiconductor chips are connected to leads consisting of conductors that are formed so that these leads surround the semiconductor chips. However, prior to this bonding operation, the bonding points, which are the points where bonding is performed, are calculated utilizing pattern matching.

First, as shown in FIG. 14, respective alignment points 32a which are reference points used for positioning are registered. In a wire bonding apparatus of the type shown in FIG. 1 in which a camera that is fastened to an XY table via a bonding head and a camera arm is moved in the horizontal direction relative to a semiconductor chip by the operation of the XY table, such alignment points are registered in the following manner: the visual field is moved by moving the XY table 1 to which the camera 7 is fastened via the bonding head 2 and camera arm 6 while an image from the camera 7 that has imaged the semiconductor chip 14a is displayed on the display screen of a monitor 39, so that the center point 32a of cross marks 32 that indicate the center of the visual field displayed on the display screen of the monitor 39 are aligned with an arbitrary point on the semiconductor chip 14a, and an input operation involving the pressing of the input switch of a manual input means 33, etc., is performed, and a region that is surrounded by rectangular reticle marks 42 and is centered on the center point 32a in this case is stored in memory as a template image, and the coordinates on the XY table 1 in this case are stored in a data memory 36 as alignment points.

Generally, in order to minimize detection error, two places are selected for the pad side (Pa1x, Pa1y), (Pa2x, Pa2y), and two places are selected for the lead side (La1x, La1y), (La2x, La2y), as the alignment points from a diagonal line in the vicinity of the corners of the semiconductor chip 14a.

Next, when the center point 32a of the cross marks 32 is aligned with appropriate positions on the individual pads P and leads L, typically with points that are located substantially in the centers of the respective pads P and leads L; and then the input switch is pressed. Thus, the coordinates of the respective bonding points are stored in the data memory 36.

In run time processing (i.e., processing during actual production of the product), a new semiconductor device 14 that is the object of detection is set, and the XY table 1 is moved by the control of an operating device so that the area in the vicinity of each registered alignment point A0 becomes the visual field of the camera 7 (FIG. 15). An image of the new semiconductor device 14 is acquired by the camera 7. Then, using the registered reference image, the reference image is superimposed on the image of the object of detection in a relative position which is such that the amount of coincidence between the image of the object of detection and the reference image shows a maximum value; and the amount of positional deviation ($\Delta X$, $\Delta Y$) between the position coordinates of the center point 32a in this attitude on the XY table 1 and the position coordinates of the alignment point A0 (which is the position of the center point 32a at the time of the previous registration of the template image) on the XY table 1, e.g., (Pa1x, Pa1y), is determined by pattern matching detection. The positional deviation is similarly determined for the remaining alignment points 32a, the calculated amounts of positional deviation ($\Delta X$, $\Delta Y$) are added to the position coordinates of the alignment points measured at the time of the previous registration of the template image, e.g., as (Pa1x+$\Delta X$, Pa1y+$\Delta Y$), and the values thus obtained are designated as new alignment points Am. "Am" is a symbol, and "m" referred to here is not a numerical value that has a range.

Next, the positions of the respective pads and leads are determined by calculation from the positions of the new alignment points Am in a form that preserves the relative positions of the respective pads and leads at the time of registration with respect to the alignment points A0 (hereafter, this is referred to as "position correction"), so that the actual bonding points are determined. Then, bonding operations are performed on these actual bonding points.

In cases where the semiconductor device 14 that is the object of detection is disposed in an attitude that includes a positional deviation in the rotational direction, high-precision position correction of the pads P and leads L cannot be accomplished. Such a high-precision position correction cannot be accomplished even if pattern matching detection using a registered reference image is performed.

The inherent reason for this is as follows: namely, if the image of the object of detection and the reference image are superimposed so that the amount of coincidence for the pattern serving as a reference (pads P in FIG. 15) shows a maximum value, the positions of the new alignment points Am stipulated by the relative positions with respect to the pattern serving as a reference should coincide with the positions of the original alignment points A0 similarly stipulated by the relative positions with respect to the pads in the reference image. However, as shown in FIG. 16, when the semiconductor device 14 that is the object of detection is disposed in an attitude that includes a positional deviation in the rotational direction, the original alignment points A0 and new alignment points Am do not coincide even if the image of the object of detection and the reference image are superimposed so that the amount of coincidence shows a maximum value for the pattern serving as a reference (pads P in FIG. 16).

The above problem can be solved by way of setting points, which tend not to be affected by the rotation of the attitude of the semiconductor device 14 that is the object of detection, as the alignment points. However, it is difficult for the operator to find such alignment points.

The error that is caused by this positional deviation in the direction of rotation of the object of detection is not a problem if the pitch between the pads P or between the leads L is sufficiently large. However, such error is a major problem in cases where it is necessary to deal with the finer pitches that have been used in recent years, i.e., finer pitches between the pads P and between the leads L.

Meanwhile, various methods in which pattern matching with the image of the object of detection is performed while the reference image is rotated have been proposed (see Japanese Patent Application Laid-Open (Kokai) No. 9-102039, for instance). In such methods, position detection that takes positional deviation in the direction of rotation into account is possible. However, pattern matching in increments of several degrees must be performed in the direction of rotation for numerous points within the visual field. As a result, the amount of calculations required greatly increases, thus slowing down the recognition speed. Thus, such methods are not practical.

SUMMARY OF THE INVENTION

Accordingly, the object of the present invention is to provide a means which makes it possible to realize high-precision position detection without performing pattern matching in the direction of rotation (which tends to require a large amount of calculations) even in cases where the object of detection is disposed in an attitude that includes a positional deviation in the direction of rotation.

The above object is accomplished by the image processing method of the present invention that comprises the following sequential steps in which:

- a theoretical value of a position of a reference point in a rotated image, which is obtained by rotating a reference image that contains the reference point by a specified angle, is calculated,
- a measured value of the position of the reference point is detected by performing pattern matching on the rotated image,
- a difference between the theoretical value and the measured value is retained as a calibration amount that corresponds to the specified angle,
- the measured values of positions of at least two reference points in an object of detection are detected by performing pattern matching on an image of the object of detection,
- the angle of rotation of the object of detection with respect to the reference image is calculated on a basis of the measured values of the positions of the at least reference points that have been detected, and
- the accurate positions of the reference points in the object of detection are calculated on a basis of the measured values of the positions of the reference points in the object of detection, the angle of rotation of the object of detection, and the calibration amount.

In the above method of the present application, the error in pattern matching detection for the rotation of the object of detection is acquired by performing pattern matching of the rotated image and reference image beforehand; this error is retained as a calibration amount, and then the measured values in the run time (that is a time period in which actual products are manufactured) are corrected by utilizing this calibration amount while taking the angle of rotation of the object of detection into account. Accordingly, even in cases where the object of detection is disposed in an attitude that includes a positional deviation in the direction of rotation, high-precision position detection can be accomplished without performing pattern matching in the direction of rotation, which tends to require a large amount of calculations.

In the above method, the calibration amount can be retained for each of different angles.

Since the calibration amounts are retained for each one of different angles, a correction can be performed which is more accurate than that possible in cases where a calibration amount for a single angle is used.

Furthermore, in the method of the present invention, in executing the pattern matching that is performed on the image of the object of detection, the above-described at least two reference points can be included in a single image frame.

By way of this method, the image acquisition in positioning can be completed at one time, thus improving the working efficiency of the position detection process.

In addition, the method of the present invention may additionally includes a step that calculates working processing points in the object of detection by way of using reference points in the object of detection as a reference.

With this addition of such step, working processing points on the object of detection are calculated using the reference points as a reference. Accordingly, the positions of the reference points are determined with a high degree of precision, and thus the precision of the detection of the positions of the working processing points can be increased.

Furthermore, the method of the present invention can be executed by way of calculating working processing points that are present outside the image frame in the object of detection.

By way of calculating working processing points that are present outside the image frame in the object of detection, the relative movement distance between the camera and the object of detection during the imaging of a plurality of reference points can be reduced compared to the relative movement distance in a structure in which working processing points present inside a region surrounded by a plurality of alignment points are calculated as in a conventional method, and the working efficiency of the position detection process can be improved. Especially, when calculating at least two reference points in a single image frame, the relative movement distance between the camera and the object of detection during the imaging of the two reference points can be reduced to zero.

The above object is further accomplished by a unique structure of an image processing device that includes:

- a theoretical value calculating means that calculates a theoretical value of a position of a reference point in a rotated image which is obtained by rotating a reference image that contains the reference point by a specified angle,
- a trial processing means that detects measured value of a position of the reference point by performing pattern matching on the rotated image,
- a calibration amount retention means that retains a difference between the theoretical value and the measured value as a calibration amount that corresponds to the angle of rotation,
- an object detection means that detects measured values of positions of at least two reference points in an object of detection by performing pattern matching on an image of the object of detection,
- an object rotation angle calculating means that calculates an angle of rotation of the object of detection with respect to the reference image on a basis of the measured values of the positions of the at least two reference points that have been detected, and
- a calibration processing means that calculates accurate positions of the reference points in the object of detection on a basis of the measured values of the reference points in the object of detection, the angle of rotation of the object of detection, and the calibration amount.

The present invention further provides a bonding apparatus that includes the above-described image processing device.

The image processing device and the bonding apparatus that uses the image processing device provide advantages in which by way of performing pattern matching of the rotated image and reference image beforehand, the error in pattern matching detection for the rotation of the object of detection is acquired, this error is retained as a calibration amount, and then the measured values in the run time are corrected by utilizing this calibration amount while taking the angle of rotation of the object of detection into account. Accordingly, even in cases where the object of detection is disposed in an attitude that includes a positional deviation in the direction of rotation, high-precision position detection can be accomplished without performing pattern matching in the direction of rotation, which tends to require a large amount of calculations.

BRIEF DESCRIPTION OF THE DRAWINGS

FIG. 9 is an explanatory diagram of the calibration amount tables;

DETAILED DESCRIPTION OF THE INVENTION

First Embodiment

Figure 1:
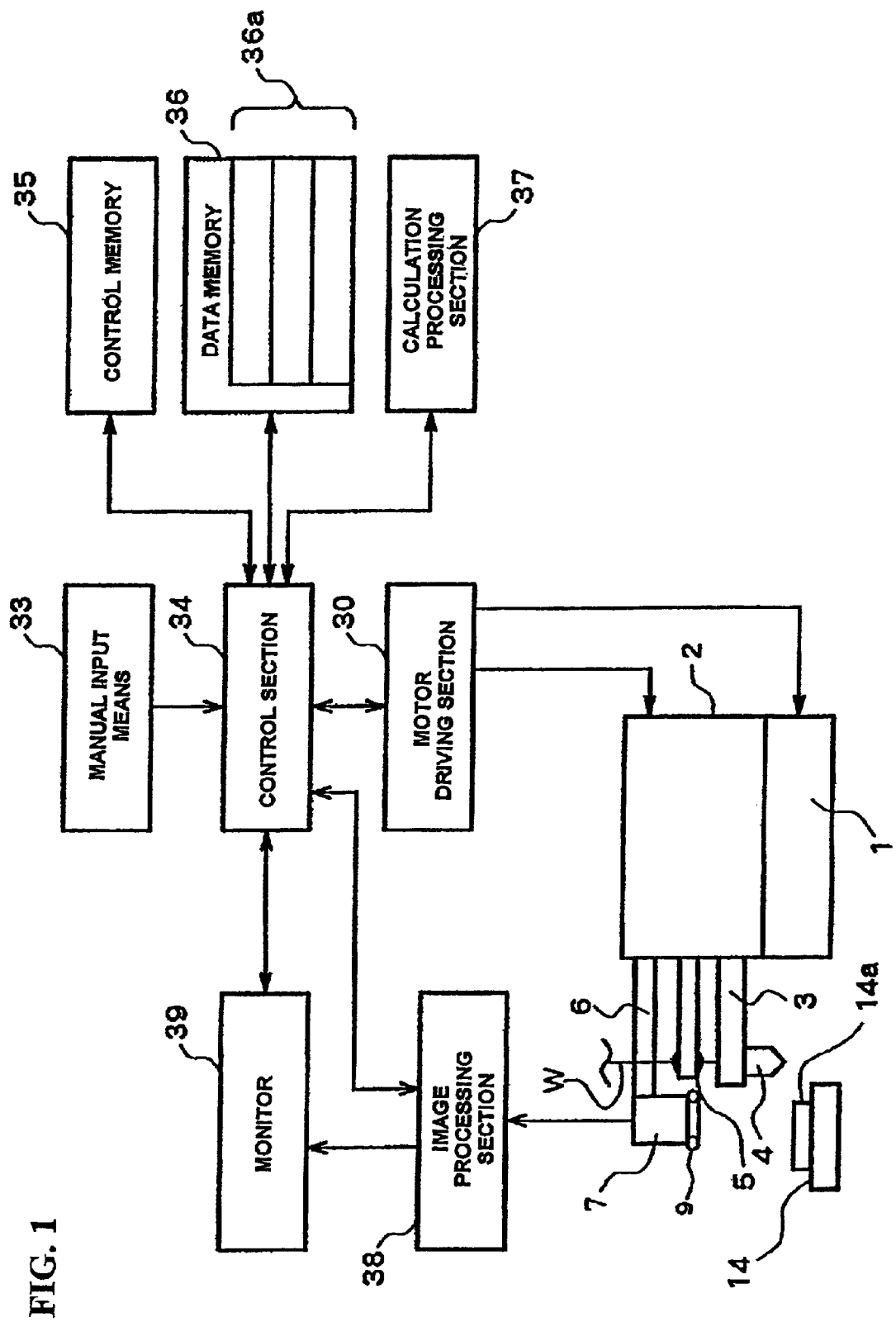
FIG. 1 is a block diagram showing the structure of a bonding apparatus according to the embodiment of the present invention.

In FIG. 1, that shows a wire bonder according to one embodiment of the present invention, a bonding arm 3 is disposed on a bonding head 2 that is mounted on an XY table 1, and a tool 4 is attached to the tip end portion of the bonding arm 3. The bonding arm 3 is driven in the vertical direction by a Z-axis motor (not shown). A damper 5 that holds a wire W is disposed above the bonding arm 3. The lower portion of the wire W is passed through the tool 4. The tool 4 in this embodiment is a capillary.

A camera arm 6 is attached to the bonding head 2, and a camera 7 is fastened to the camera arm 6. The camera 7 takes images of a semiconductor device 14 on which a semiconductor chip 14a, etc. is mounted. The XY table 1 is accurately moved in the X direction and Y direction, which are mutually perpendicular coordinate axis directions in the horizontal plane, by means of XY table motors (not shown) consisting of two pulse motors, etc., installed in the vicinity of the XY table 1. The structure described so far is known in prior art.

The XY table 1 is driven, via a motor driving section 30 and the XY table motors, by way of the commands from a control section 34 that is, for instance, a microprocessor. The images taken by the camera 7 are converted into image data that consist of an electrical signal. This image data is processed by an image processing section 38 and inputted into a calculation processing section 37 via the control section 34. Various calculations including calculations involved in position detection (described later) are performed in the calculation processing section 37, and programs and data used for such calculations are temporarily held in a control memory 35. A manual input means 33 and a monitor 39 are connected to the control section 34. The manual input means 33 is preferably at least a pointing device such as a mouse input device (called "mouse"), etc., equipped with a direction-indicating function in the X and Y directions and a setting signal input function based on an input button. The manual input means 33 can be a known keyboard equipped with a character input function.

Figure 4:
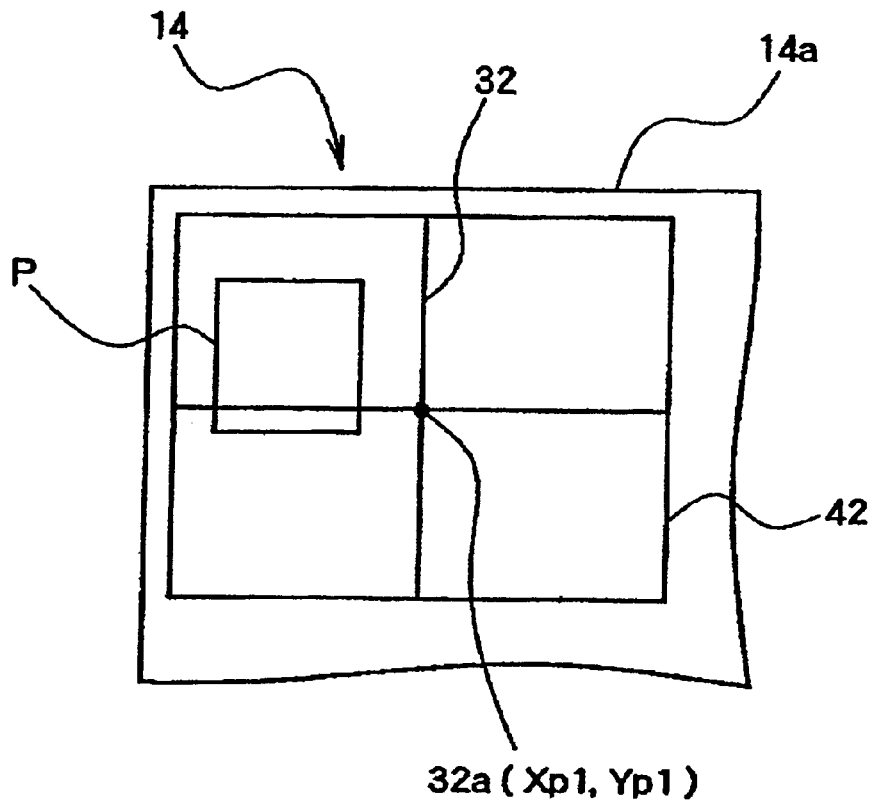
FIG. 4 is an explanatory diagram of the reference image in the first embodiment.

The monitor 39 is, for instance, a CRT (cathode ray tube) or a liquid crystal display device. Images acquired by the camera 7, associated coordinate values, numerical values such as magnifications, etc. and various types of character messages (described later), etc. are displayed on the display screen of the monitor 39 based upon the output of the control section 34. In the position detection process, as shown in FIG. 4, cross marks 32 and a rectangular reticle mark 42 are displayed on the display screen. The cross marks 32 indicate the center of the visual field, and the rectangular reticle mark 42 is displayed and stored in memory as a mark that indicates a region within the visual field that surrounds the cross marks 32. The intersection point of the vertical line and horizontal line in the cross marks 32 is the center point 32a.

The data memory 36 is a known random-access memory, a hard disk drive, etc. that allows the reading and writing of data. A data library 36a is accommodated in the storage region of the data memory 36. Template images (described later), past values such as detected position coordinates, etc., default values which are the initial states of these values, and various types of setting values used in other operations of the image processing device, are stored in this data library 36a. Various types of data are stored (as will be described later) by signals from the control section 34.

In the first embodiment, the registration of alignment points and respective bonding points, and the storage in memory of the correction amount, are first performed as registration processing for a new semiconductor device 14.

Figure 2:
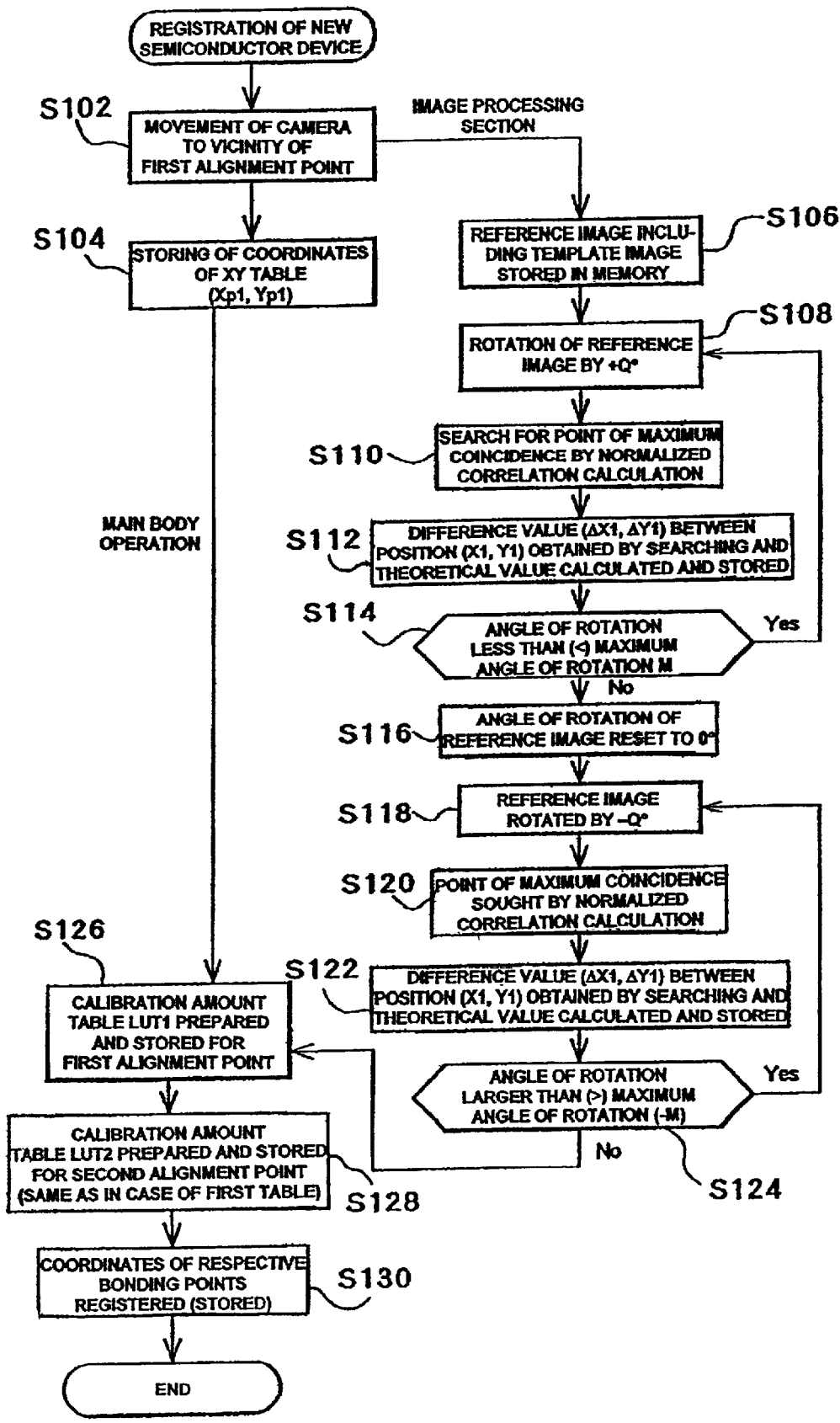
FIG. 2 is a flow chart of one example of the registration processing of a new semiconductor device in the first embodiment of the present invention.

Then, the position detection by pattern matching is performed as processing in the run time FIG. 2 is a flow chart that shows the registration processing for a new semiconductor device 14.

First, the XY table 1 is driven in accordance with the output of the control section 34, so that the camera 7 is moved to the vicinity of the point that is to be the first alignment point (S102). After this movement, the image acquired by the camera 7 is as shown in FIG. 4.

Next, the position coordinates (Xp1, Yp1) of the center point 32a of the cross marks 32 in the moved attitude are stored in the data memory 36 in accordance with the output of the control section 34 (S104). In the shown embodiment, a point that coincides with the center point 32a which is the center point of a visual field that contains pad P is used as the first alignment point A1; however, it is also possible to use the center point of the pad P as the alignment point.

The semiconductor device 14 is imaged by the camera 7 in this position; and the image data obtained by conversion into an electrical signal is processed by the image processing section 38 and stored in the data library 36a of the data memory 36 as a reference image (S106). Within this reference image, the region surrounded by the reticle marks 42 is used as a template image in the position detection process (described later). The image indicated by solid lines in FIG. 4, and the upright images indicated by dotted lines in FIGS. 5 through 8, are the "reference image".

Figure 5:
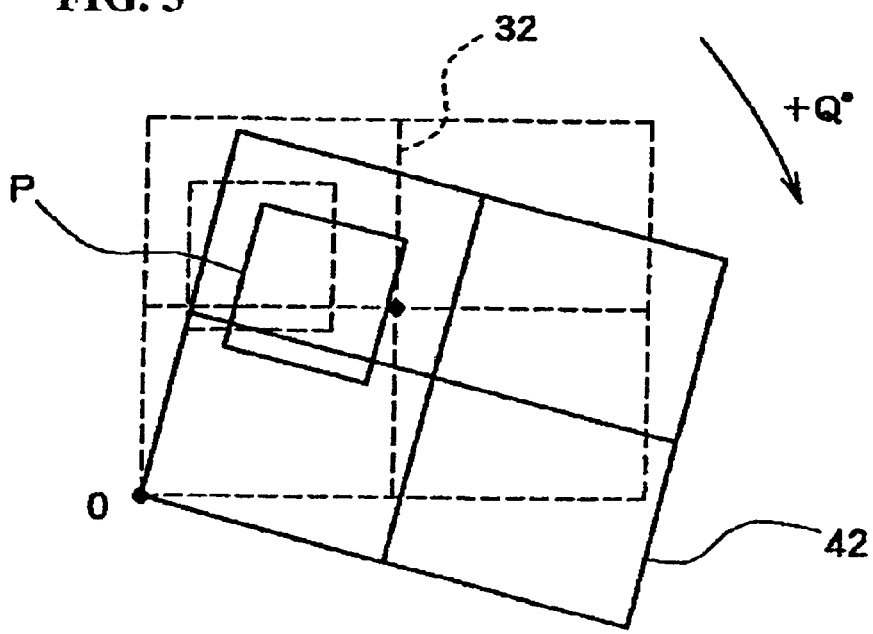
FIG. 5 is an explanatory diagram that shows the rotated image (forward direction) in the first embodiment.
Figure 6:
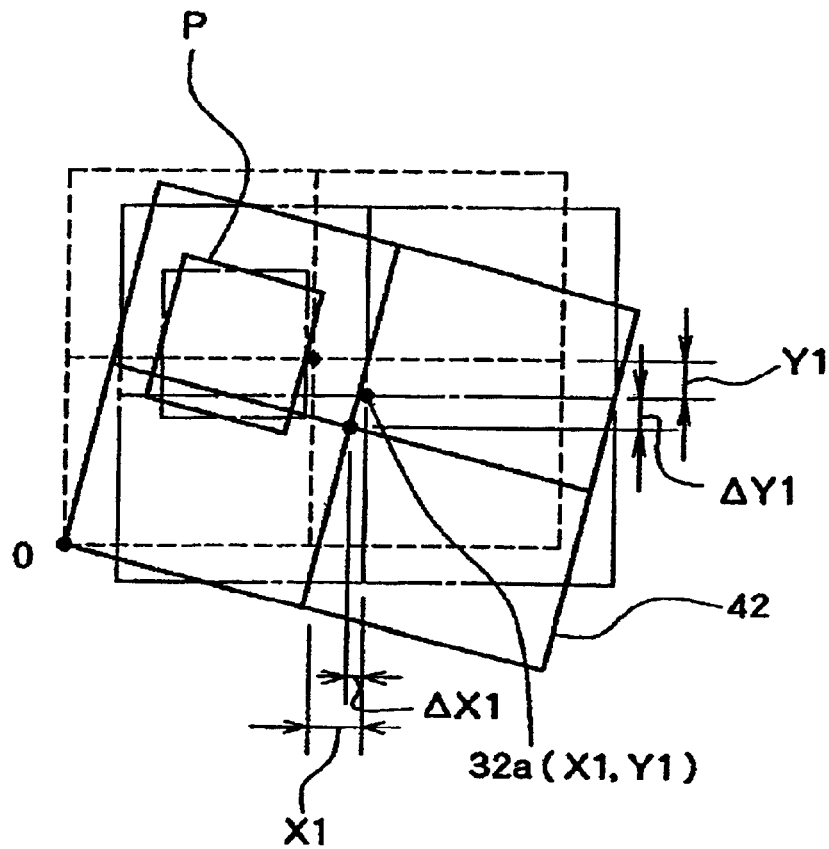
FIG. 6 is an explanatory diagram that shows the pattern matching process for the rotated image (forward direction) in the first embodiment.

Next, in the operational processing section 37, processing that rotates the reference image by +Q° (degrees) is performed (S108). This rotation is performed about the point O at the lower left corner of the reticle marks 42 in FIG. 5. The image obtained as a result of such rotation processing will be referred to below as the "rotated image". In FIGS. 5 and 6, and in FIGS. 7 and 8 that will be described later, the images in an inclined attitude indicated by solid lines are the reference image.

Next, as pattern matching processing of the rotated image and reference image, the point of maximum coincidence with the reference image in the rotated image is sought by way of using a normalized correlation calculation (S110). More specifically, the correlation value R between the rotated image and reference image that is calculated in the following Numerical Expression 1 is calculated for each pixel within the region of the rotated image or for respective reference points that are disposed in a discrete manner with the region of the rotated image; then, the point at which the correlation value R shows a maximum value is determined as the point of maximum coincidence.

$$R = \frac{\{N\sum IM - \{\sum I \sum M\}\}}{\sqrt{\{N\sum I^2 - \{\sum I\}^2\}} \sqrt{\{N\sum M^2 - \{\sum M\}^2\}}}$$ Numerical Expression 1

Range of $R: -1 \leq R \leq 1$

In the above formula, R is the correlation value, N is the number of pixels within the rotated image, I is the brightness value at respective positions within the rotated image, and M is the brightness value of the rotated image.

Next, the difference (ΔX1, ΔY1) between the coordinates (X1, Y1) of the point of maximum coincidence thus determined and the theoretical value is determined, and this difference is stored in the data memory 36 (S112, FIG. 6). This theoretical value is calculated using a simple approximation calculation, e.g., $r \cdot \sin^2 \theta$ for the X component and $r \cdot \sin \theta \cos \theta$ for the Y component, where r is the distance between the point O and the center point 32a of the cross marks 32, and θ is the angle of rotation. This approximation calculation utilizes the fact that the arc length in a fan shape of radius r over a very small angle of θ can be approximated as $r \cdot \sin \theta$. However, it is also possible to execute the accurate calculation without using such an approximation calculation, and the theoretical value can be determined by a table treatment instead.

Next, a judgement is made as to whether or not the current angle of rotation is within the range of a predetermined maximum angle of rotation M (S114). In cases where the result of this judgement is affirmative, the processing from step S108 through step S112 is repeated. In this way, difference values (ΔX1, ΔY1) for the cases of angles of rotation Q, 2Q, 3Q, 4Q and 5Q are calculated.

Figure 7:
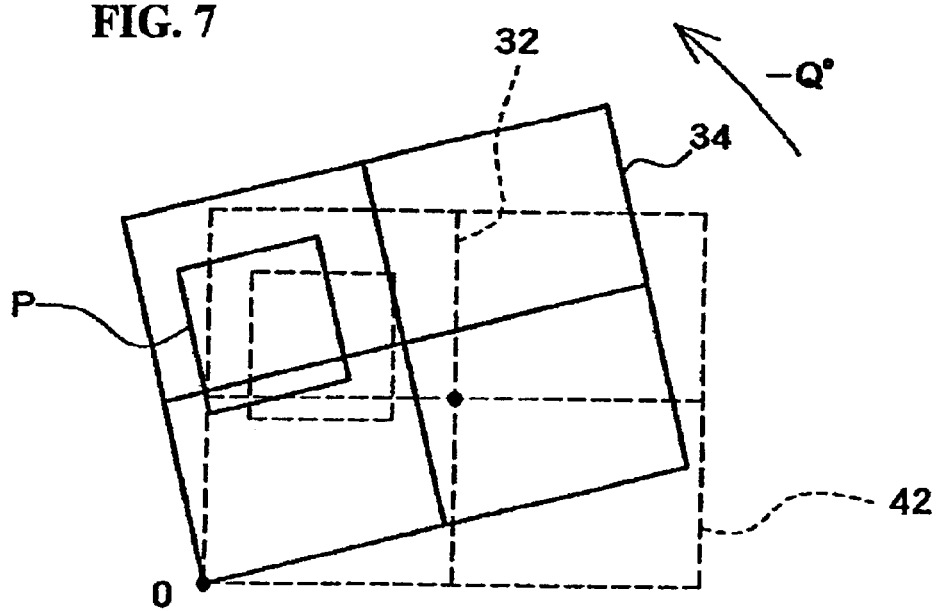
FIG. 7 is an explanatory diagram that shows the rotate image (reverse direction) in the first embodiment.
Figure 8:
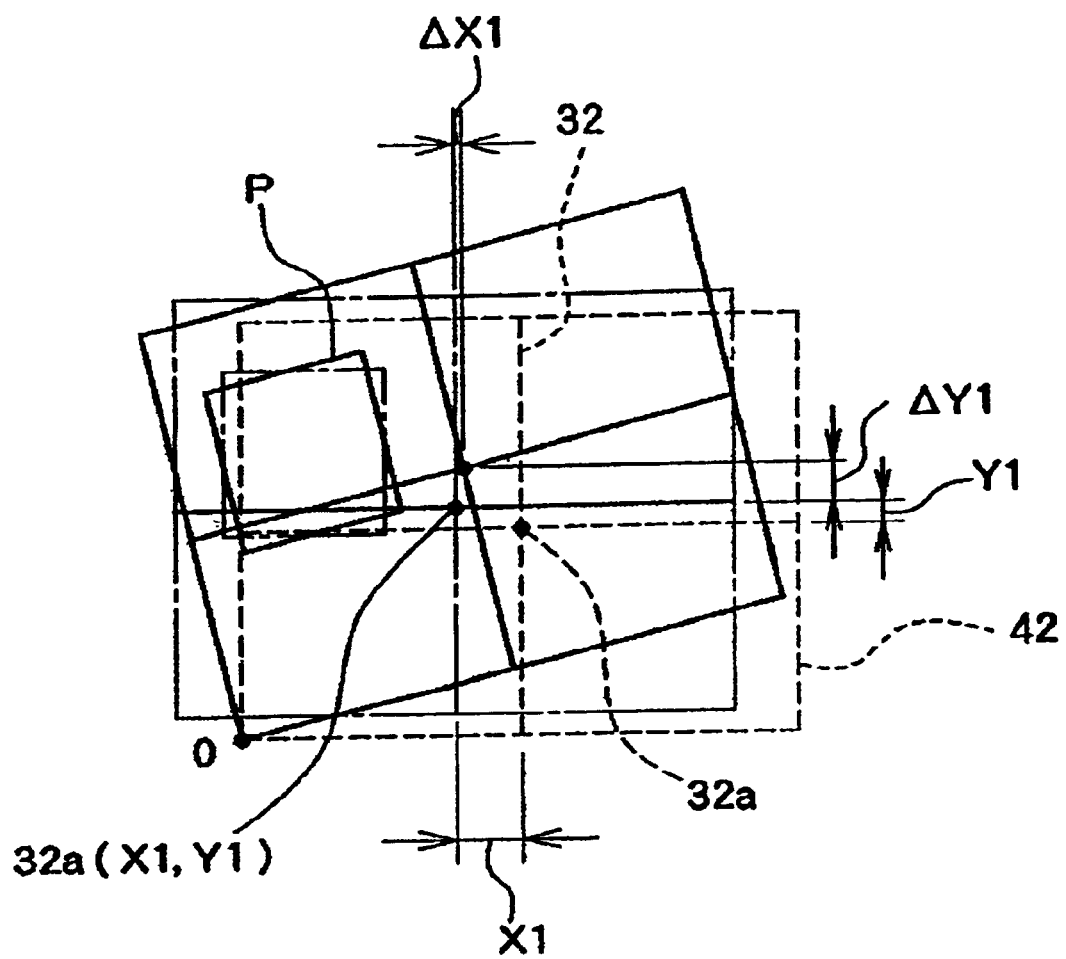
FIG. 8 is an explanatory diagram that shows the pattern matching process for the rotated image (reverse direction) in the first embodiment.

In cases where the current angle of rotation has reached the maximum angle of rotation M, the processing is then reset to an angle of rotation of 0° (S116), and similar processing is performed in steps S118 through S124 with the reference image being rotated by -Q° at a time (FIG. 7). Difference values (ΔX1, ΔY1) from the theoretical value are respectively calculated for the cases of angles of rotation -Q, -2Q, -3Q, -4Q and -5Q, and these difference values are stored in the data memory 36. In cases where the current angle of rotation is less than a predetermined maximum angle of rotation M, then the processing shifts to step S126.

In step S126, a calibration amount table LUT1 is created for the first alignment point A1, and this table is stored in the data memory 36. In this calibration amount table LUT1, as shown in FIG. 9, angles of rotation and the difference values (ΔX1, ΔY1) at these angles of rotation are stored in association with each other.

Next, angles of rotation and difference values (ΔX2, ΔY2) for these angles of rotation are calculated for the second alignment point A2 in the same manner as the processing (S102 through S126) performed for the first alignment point A1, and a calibration amount table LUT2 is prepared and stored in the data memory 36 (S128).

Next, the coordinates of the respective bonding points are registered (S130). The registration of the coordinates of these respective bonding points is accomplished by moving the visual field to appropriate positions for the individual pads P and leads L (other than the pads P selected as the first alignment point A1 and second alignment point A2), typically points that are located substantially at the center of each pad P and lead L, by aligning the center point 32a of the cross marks 32 with these points, and then by pressing the input switch of the manual input means 33, etc. The coordinates of the respective bonding points are thus stored in the data memory 36.

Instead of using the above manual input method, it is also possible to determine points located substantially at the center of each pad P and lead L by image processing and then to store these coordinate values in the data memory 36.

The processing described above is the processing that is performed for the registration of a new semiconductor device 14.

Figure 3:
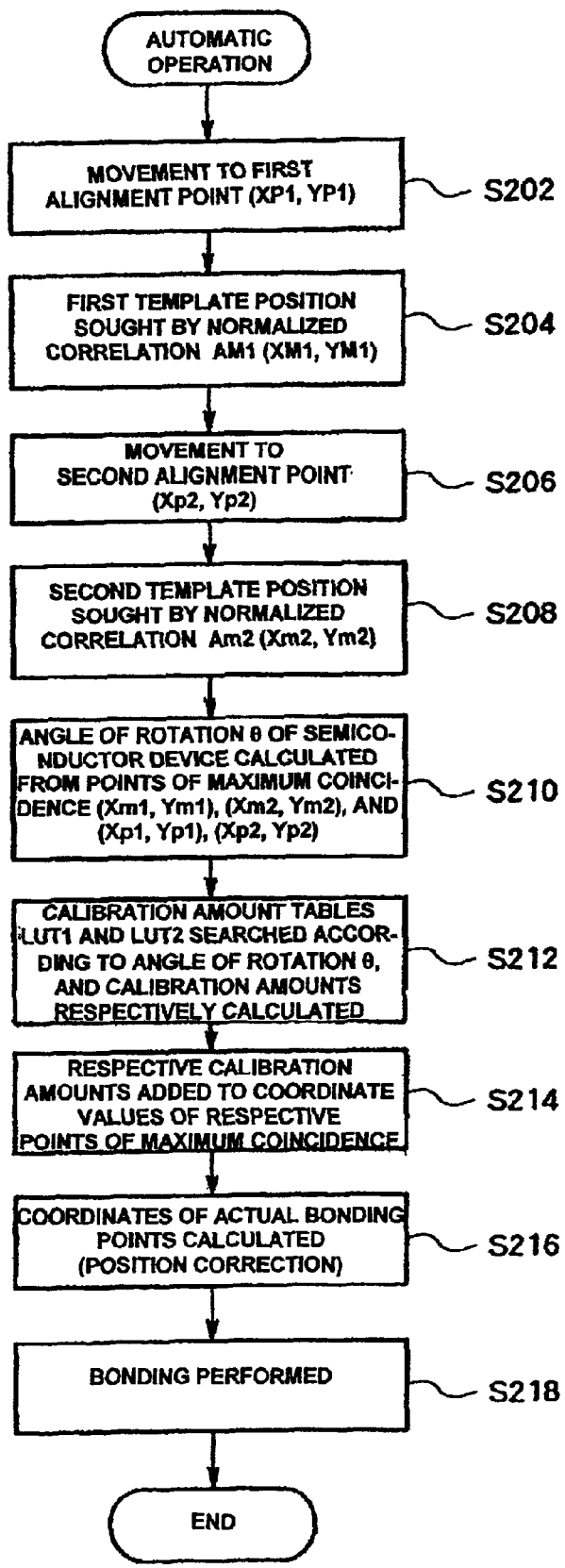
FIG. 3 is a flow chart of one example of the run time processing in the first embodiment.
Figure 10:
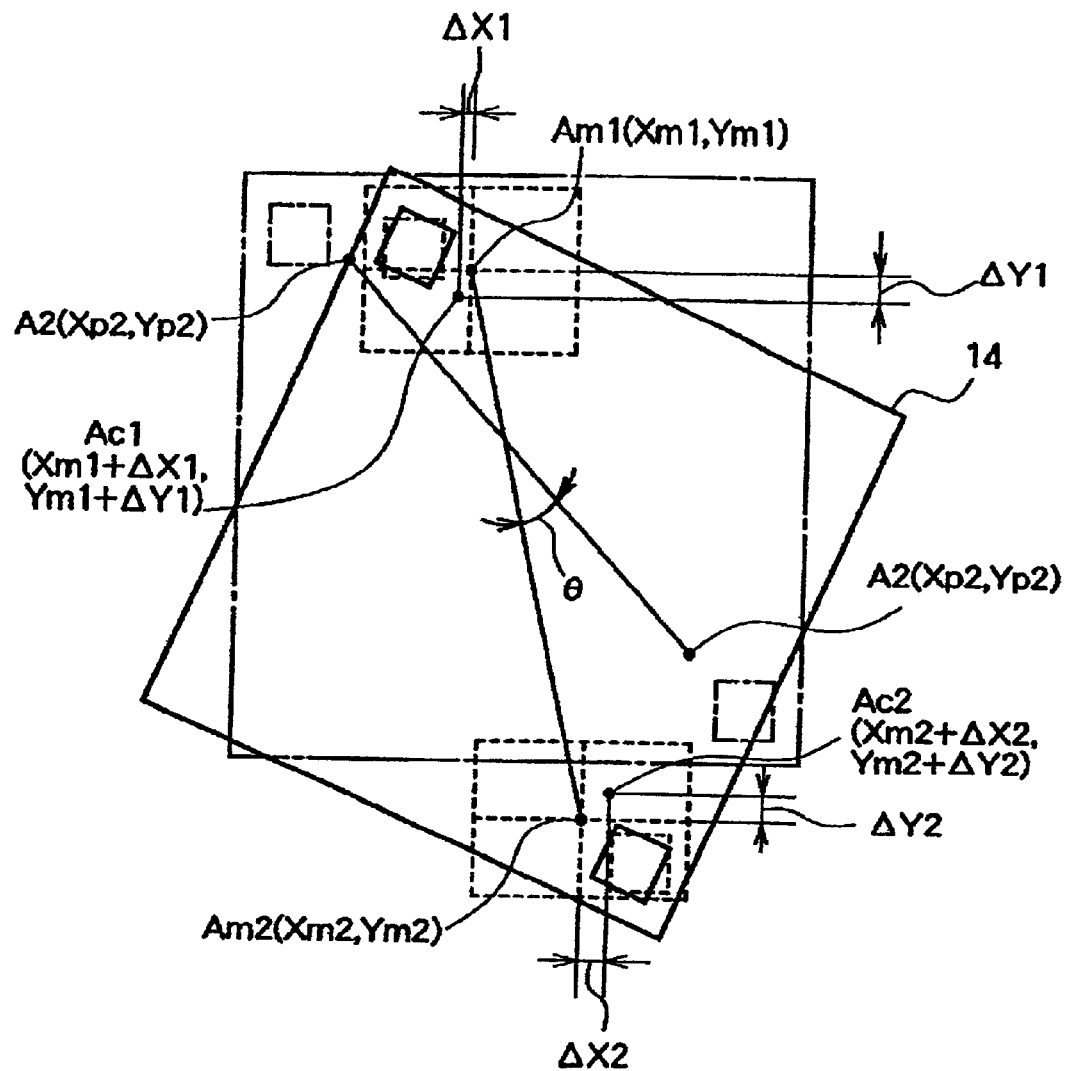
FIG. 10 is an explanatory diagram that shows the pattern matching process of the image of the object of detection and the reference image in the first embodiment.

The run time processing is shown in FIGS. 3 and 10.

First, the new semiconductor device 14 that is the object of detection is placed in position, and the XY table 1 is operated by the output of the control section 34, thus moving the camera 7 so that the center point of the visual field of the camera 7 coincides with the position (Xp1, Yp1) of the first alignment point A1 (S202). Then, the image of the object of detection is acquired from this position by imaging the semiconductor device 14, the object of detection, with the camera 7.

Next, pattern matching of the image of the object of detection and the registered reference image is performed, and the point of maximum coincidence Am1 (Xm1, Ym1) with the reference image in the object of detection is sought using a normalized correlation calculation (S204, FIG. 10). "Am1" in the "point of maximum coincidence Am1" and "Am2" in the "point of maximum coincidence Am2" are both symbols; and "m" referred to here is not a numerical value that has a range. This calculation is performed using the same normalized correction equation as the above-described Numerical Expression 1. The correlation value R between the image of the object of detection and the reference image is calculated for each pixel within the region of the image of the object of detection, or for respective reference points disposed in a discrete manner within the region of the image of the object of detection; and then points where the correlation value R shows a maximum value are sought.

Next, in steps S206 and S208, similar processing is performed for the second alignment point, thus obtaining the position coordinates (Xm2, Ym2) of the point of maximum coincidence Am2 with the reference image.

Then, the angle of rotation θ of the semiconductor device 14 that is the object of detection is calculated using the position coordinates (Xm1, Ym1) and (Xm2, Ym2) of the detected points of maximum coincidence Am1 and Am2 and the position coordinates (Xp1, Yp1) and (Xp2, Yp2) of the first alignment point A1 and second alignment point A2 (S210). This calculation is performed by determining the difference between the angle of inclination of a line segment connecting the points of maximum coincidence Am1 and Am2 and the angle of inclination of a line segment connecting the first alignment point A1 and second alignment point A2.

Next, using the angle of rotation θ thus obtained, the calibration amount tables LUT1 and LUT2 are searched, and the calibration amounts for the first alignment point A1 and second alignment point A2 corresponding to this angle of rotation θ are respectively calculated (S212). This processing may be performed in approximate terms by selecting the difference values (ΔX1, ΔY1) and (ΔX2, ΔY2) stored in memory for the angle of rotation that is closest to the angle of rotation θ among the angles of rotation −5Q through +5Q that are discretely stored in the calibration amount tables LUT1 and LUT2. Alternatively, an appropriate interpolation calculation may be performed on the angles of rotation or difference values that are discretely stored in the calibration amount tables LUT1 and LUT2.

Next, the calibration amounts (ΔX1, ΔY1) and (ΔX2, Δ42) thus determined are added to the position coordinates (Xm1, Ym1) and (Xm2, Ym2) of the points of maximum coincidence Am1 and Am2. In this way, the accurate positions of the first alignment point A1 and second alignment point A2 in the semiconductor device 14 that is the object of detection are calculated (S214). Thus, the position coordinates (Xm1+ΔX1, Ym1+ΔY1) of the corrected first alignment point Ac1 and the position coordinates (Xm2+ΔX2, Ym2+ΔY2) of the corrected second alignment point Ac2 are determined.

Then, on the basis of the coordinates of the respective bonding points that were previously registered in step S130, the positions of the respective pads P and leads L are determined by calculation (position correction) from the positions of the first alignment point Ac1 and second alignment point Ac2 in the new semiconductor device 14 in a form in which the relative positions with respect to the first alignment point A1 and second alignment point Ac2 are preserved. The actual bonding points are thus determined (S216).

Furthermore, bonding operations are performed on these actual bonding points (S218). In other words, the XY table 1 is driven by the output of the control section 34 so that the tool 4 is moved to the respective actual bonding points, and bonding is performed on these bonding points.

As seen from the above, in the first embodiment, the theoretical values of the positions of the first and second alignment points A1 and A2 in a rotated image obtained by rotating a reference image containing these first and second alignment points A1 and A2 by a specified angle are calculated (S112, S122), and meanwhile, the measured values (X1, Y1), (X2, Y2) are detected by performing pattern matching on the rotated image (S110, S120). Then, the differences (ΔX1, ΔY1) and (ΔX2, Δ42) between the theoretical values and the measured values are retained as calibration amounts corresponding to the angle of rotation (S126, S128). In the run time, the position coordinates (Xm1, Ym1) and (Xm2, Ym2) of the points of maximum coincidence Am1 and Am2 are detected as measured values by performing pattern matching on the semiconductor device 14 that is the object of detection, and the angle of rotation θ of the semiconductor device 14 with respect to the reference image is calculated on the basis of the detected measured values (S210). Then, the position coordinates (Xm1+ΔX1, Ym1+ΔY1) of the corrected first alignment point Ac1 and the position coordinates (Xm2+ΔX2, Ym2+ΔY2) of the corrected second alignment point Ac2 are calculated as the accurate positions of the reference points. This calculation is made based upon the position coordinates (Xm1, Ym1) and (Xm2, Ym2) of the points of maximum coincidence Am1 and Am2 obtained as measured values, the angle of rotation θ and the calibration amounts (ΔX1, ΔY1) and (ΔX2, ΔY2) (S212, S214).

Thus, in the above embodiment, the error in pattern matching detection for the rotation of the semiconductor device 14 that is the object of detection is acquired by performing pattern matching of the rotated angle and the reference angle beforehand, and this error is retained as calibration amounts (ΔX1, ΔY1) and (ΔX2, ΔY2). Then, the measured values Am1 and Am2 obtained in the run time are corrected using these calibration amounts (ΔX1, ΔY1) and (ΔX2, ΔY2) while taking the angle of rotation θ of the semiconductor device 14 into account. Accordingly, even in cases where the semiconductor device 14 that is the object of detection is disposed in an attitude that contains a positional deviation in the direction of rotation, high-precision position detection can be realized without performing pattern matching in the direction of rotation, which tends to require a large amount of calculations.

Furthermore, in the above embodiment, calibration amounts (ΔX1, ΔY1) and (ΔX2, ΔY2) are retained for each of a plurality of different angles of rotation −5Q through +5Q. Accordingly, a correction can be performed which is more accurate than that possible in cases where a calibration amount for a single angle of rotation is used.

Second Embodiment

Next, the second embodiment of the present invention will be described. In the second embodiment, two alignment points are specified for a single object of detection; and in the pattern matching that is performed on the image of the object of detection, such two alignment points are included in a single image frame. The mechanical construction of the second embodiment is substantially the same as that of the first embodiment, and thus a detailed description thereof is omitted.

Figure 11:
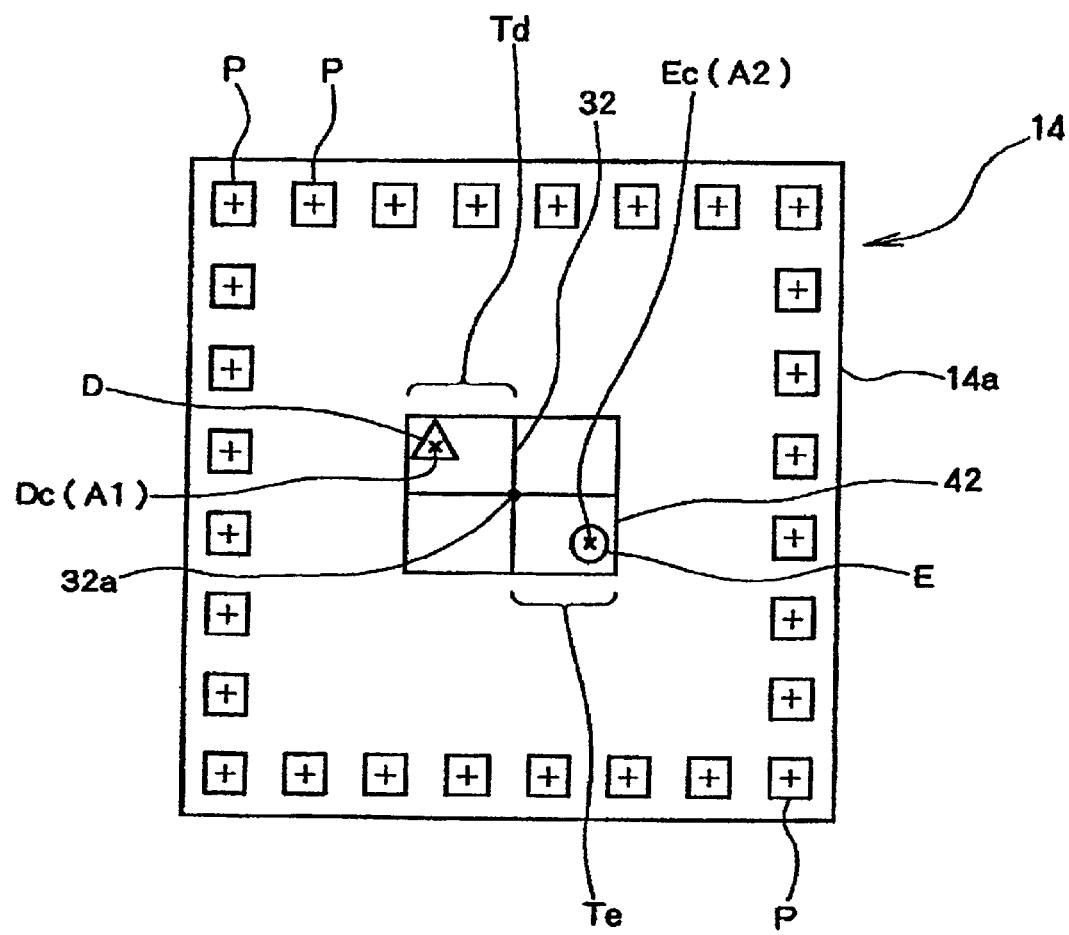
FIG. 11 is a top view of the semiconductor device used in the second embodiment of the present invention.

In the second embodiment, as seen from FIG. 11, a semiconductor device 14 which has two reference patterns D and E in a region located on the inside with respect to the positions of the pads P on the semiconductor chip 14a is used. In this embodiment, the respective center points Dc and Ec in these reference patterns D and E are used as the first alignment point A1 and second alignment point A2, respectively. In addition, the respective center points of the pads P constitute the bonding points. More specifically, bonding points that constitute working processing points are present on the outside of the region surrounded by the rectangular reticle marks 42, which constitutes the image frame that is used when the center points Dc and Ec (alignment points A1 and A2) of the two reference patterns D and E are imaged.

Next, the operation of this second embodiment will be described.

Figure 12:
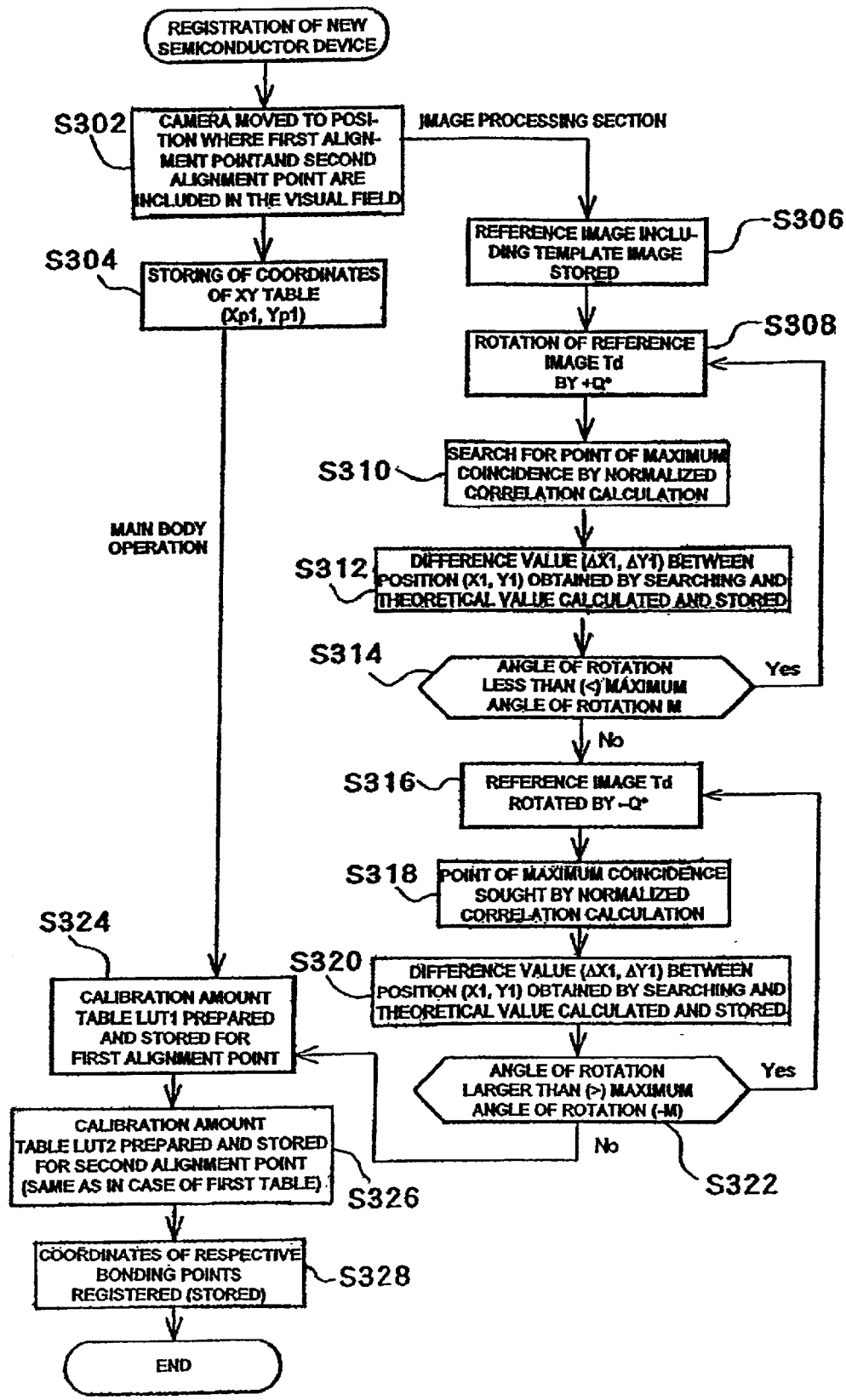
FIG. 12 is a flow chart of one example of the registration processing of a new semiconductor device in the second embodiment of the present invention.

In FIG. 12, the XY table 1 is first driven by the output of the control section 34 so that the camera 7 is moved to a position which is such that the point that is to be the first alignment point and the point that is to be the second alignment point (i.e., the center points Dc and Ec) are included in the visual field of the camera 7. In more concrete terms, the camera 7 is moved to a position which is such that both the reference patterns D and E are surrounded by the reticle marks 42 (S302). The position of the center point 32a of the cross marks 32 in this moved attitude is stored in the data memory 36 as the coordinates (Xp1, Yp1) of the reference imaging point in accordance with the output of the control section 34 (S304). Furthermore, the semiconductor device 14 is imaged by the camera 7 in this position, and the image data obtained by converting this image into an electrical signal is processed by the image processing section 38 and stored in the data memory 36 as a reference image (S306).

Here, in the reference image thus acquired, the region surrounded by the rectangular reticle marks 42 is divided into two equal parts by the cross marks 32 in both the vertical and left-right directions. Of the total of four regions produced by this division, the two regions that contain the reference patterns D and E that act as guides are respectively designated as small reference images Td and Te.

Then, by means of the same processing as that performed in steps S108 through S130 in the above-described first embodiment, calibration amount tables LUT1 and LUT2 in which angles of rotation and the difference values ($\Delta X1$, $\Delta Y1$) and ($\Delta X2$, $\Delta 42$) for these angles of rotation are stored in association with each other are respectively created for the center points Dc and Ec used as the first and second alignment points A1 and A2, and these tables are stored in the data memory 36 (S308 through S328). However, since the image of the reference pattern E that includes the center point Ec used as the second alignment point is already acquired step S306, imaging of the reference pattern E is not performed again in step S326. In other words, images for both the reference patterns D and E are acquired by a single imaging of the semiconductor device 14.

Figure 13:
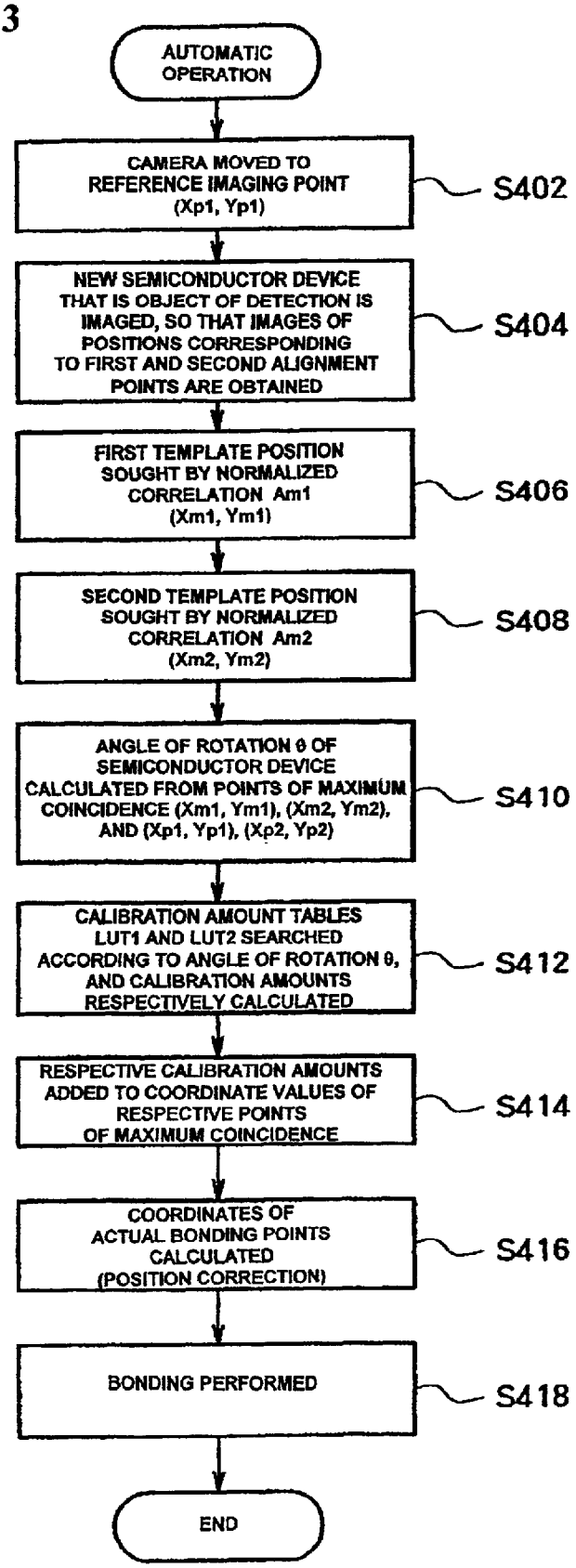
FIG. 13 is a flow chart of one example of the run time processing in the second embodiment.
Figure 14:
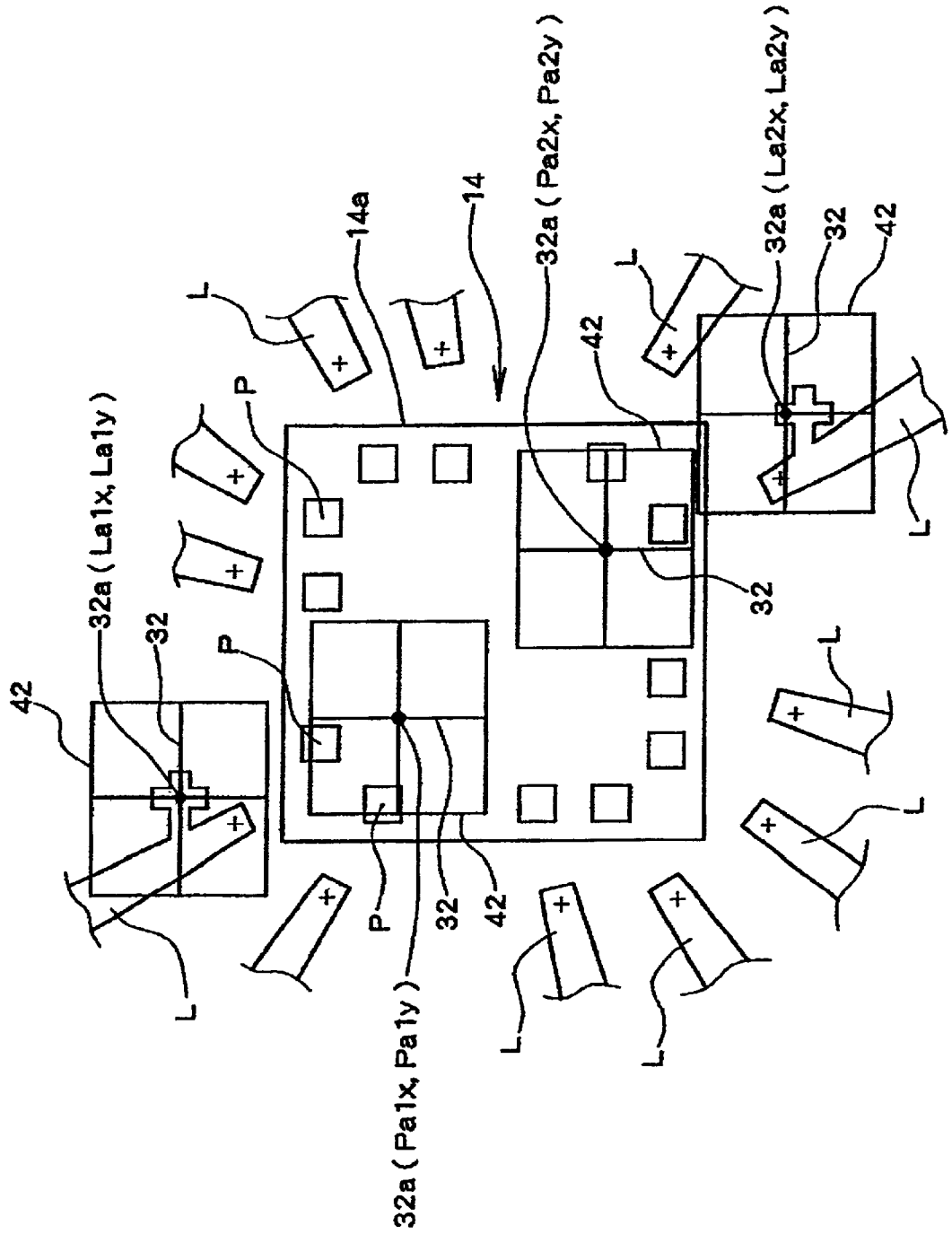
FIG. 14 is an explanatory diagram showing the alignment point setting process in a conventional method.
Figure 15:
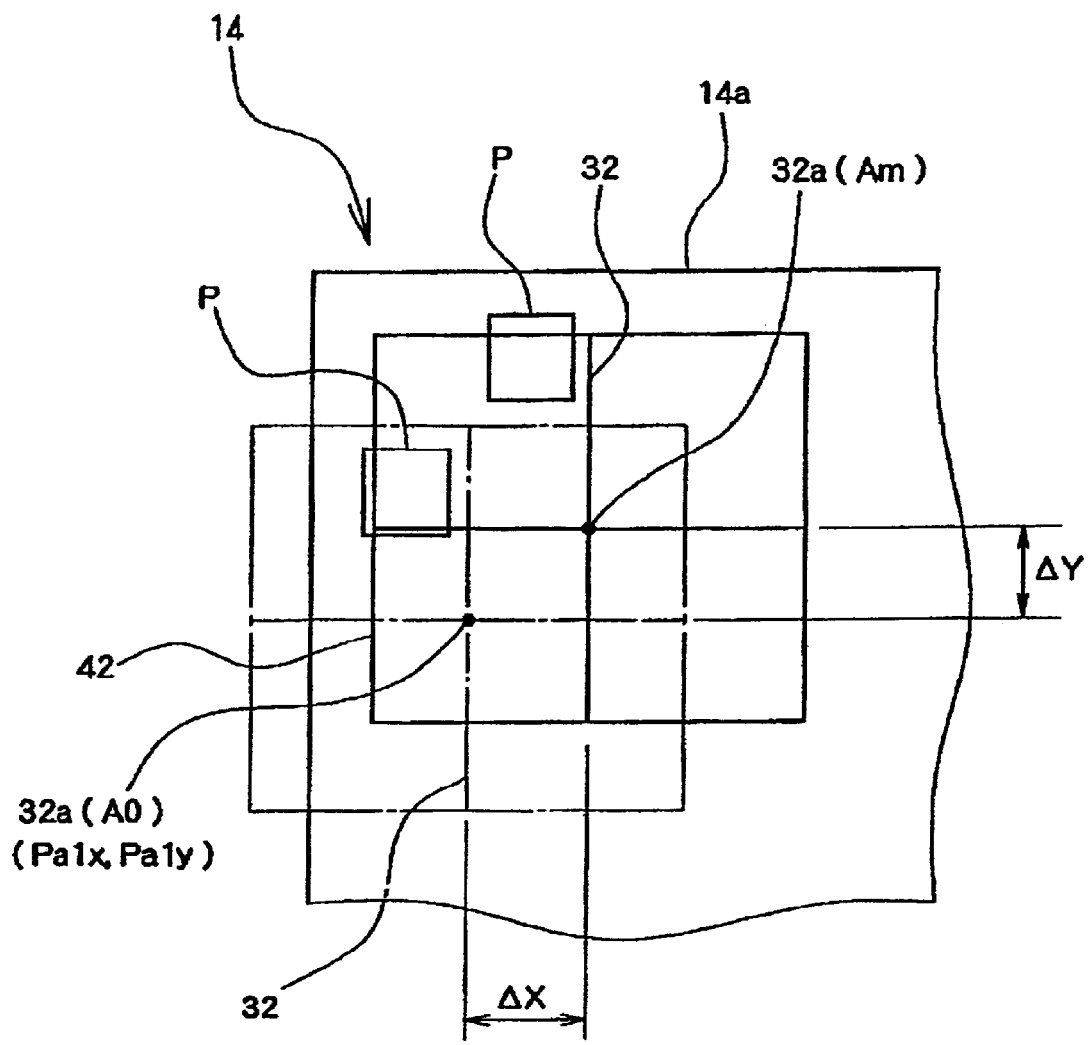
FIG. 15 is an explanatory diagram that shows the pattern matching process of the image of the object of detection and the reference image in a conventional method.
Figure 16:
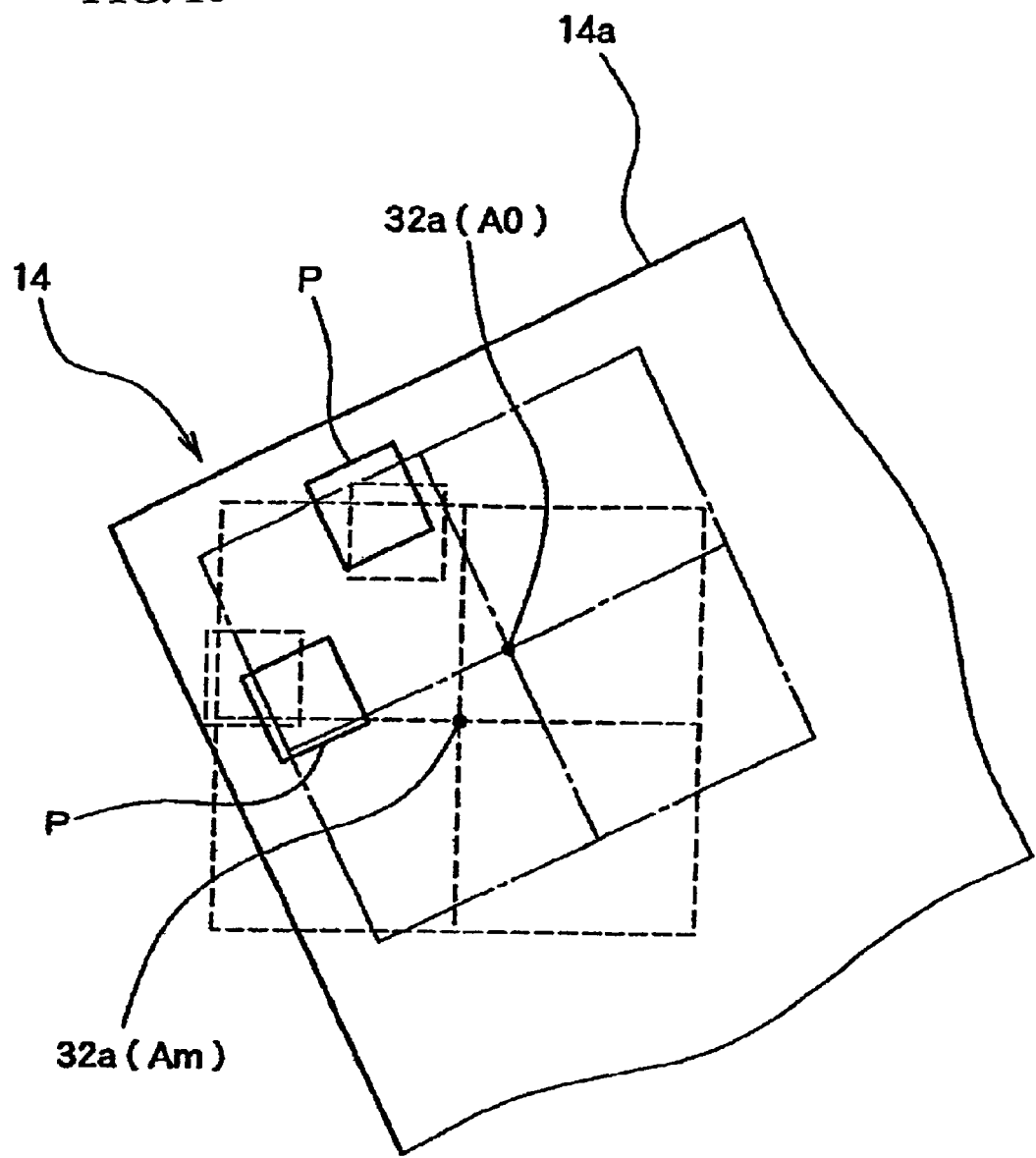
FIG. 16 is an explanatory diagram that shows the causes of position detection error in a conventional method.

In the runt time processing (FIG. 13), the position coordinates of the corrected first and second alignment points are, as in the above-described first embodiment, calculated as the accurate positions of the reference points on the basis of the position coordinates (Xm1, Ym1) and (Xm2, Ym2) of the points of maximum coincidence Am1 and Am2 (as measured values), the angle of rotation θ, and the calibration amounts stored in the calibration amount tables LUT1 and LUT2. This calculation of the position coordinates of the corrected first and second alignment points are executed by way of using the results of pattern matching performed with the center points Dc and Ec in the new semiconductor device 14 as a reference. However, in the second embodiment, since the image of the portion corresponding to the center point Ec used as the second alignment point is already acquired at the time of the imaging performed in step S404, imaging is not performed again. In other words, images for both the reference patterns D and E are acquired by a single imaging of the semiconductor device 14.

As seen from the second embodiment, respective center points Dc and Ec that constitute two alignment points A1 and A2 are specified for a single semiconductor device 14 that is the object of detection; and in the pattern matching that is performed between the object of detection and the reference image, the center points Dc and Ec are included within the region surrounded by the reticle marks 42 in the visual field of the camera 7, the reticle marks 42 constituting a single image frame. Accordingly, image acquisition at the time of positioning can be accomplished in a single pass (S404), without the need for separate acquisition of images for the respective reference patterns D and E in the semiconductor device 14 that is the object of detection. Thus, the working efficiency of the position detection process can be improved.

Furthermore, in the second embodiment, bonding points that are present outside the reticle marks 42 used as an image frame are calculated for the semiconductor device 14 that is the object of detection. Accordingly, the relative movement distance between the camera and the object of detection during the imaging of a plurality of alignment points can be reduced compared to this same distance in a construction in which the bonding points that are located on the inside of a region surrounded by a plurality of alignment points are calculated as in a conventional method. In particular, in the second embodiment, the center points Dc and Ec are contained in a region surrounded by the reticle marks 42 that constitutes a single image frame. Accordingly, the relative movement distance between the camera 7 and the semiconductor device 14 during the imaging of the two alignment points A1 and A2 of the semiconductor device 14 that is the object of detection can be reduced to zero. Consequently, the working efficiency of the position detection process is improved, and the method is especially suitable for bonding performed on large semiconductor devices 14.

In the above first and second embodiments, correlation values are used as indices for evaluating the amount of coincidence between the reference image and the rotated image or the amount of coincidence between the reference image and an input image. However, such is merely an example. In regards to the amount of coincidence treated in the present invention, various other universally known methods for evaluating the degree of coincidence may be employed. For example, a method that uses residual differences can be employed. Furthermore, in cases where the amount of coincidence between binary images is evaluated, the count value obtained by a method in which pixels whose values coincide are counted as 1 (one) and pixels whose values do not coincide are counted as 0 (zero) can be used as the amount of coincidence.

In addition, in the embodiments described above, the alignment points are calculated using the pads P and reference patterns D and E. However, it is not essential that the alignment points be determined using the pads P and reference patterns D and E; and other patterns (especially shapes of portions of the semiconductor chip 14a), unique arrangements of a plurality of patterns, and combinations of both, may be used as long as these shapes are unique detectable shapes that appear on the semiconductor device 14. Furthermore, in the embodiments described above, mainly bonding points on the pads P are calculated. However, it is indeed possible to perform the same process in the calculation of bonding points on the leads L or other members. Furthermore, though in the embodiments described above, the number of alignment points is set as two (2), the present invention is applicable to an apparatus that uses three or more alignment points.

The above embodiments are described above with reference to a wire bonding apparatus. However, the present invention can be widely used for position detection in other types of semiconductor manufacturing apparatuses and in other apparatuses using pattern matching, and such apparatuses should be construed to be in the scope of the present invention.

What is claimed is:

1. An image processing method comprising the steps of:
    calculating a theoretical value of a position of a reference point in a rotated image which is obtained by rotating a reference image that contains said reference point by a specified angle;
    detecting a measured value of said position of said reference point by performing pattern matching on said rotated image;
    retaining a difference between said theoretical value and said measured value as a calibration amount that corresponds to said specified angle;
    detecting measured values of positions of at least two reference points in an object of detection by performing pattern matching on an image of said object of detection;
    calculating an angle of rotation of said object of detection with respect to said reference image on a basis of said measured values of said positions of said at least two reference points that have been detected; and
    calculating accurate positions of said reference points in said object of detection on a basis of said measured values of said positions of said reference points in said object of detection, said angle of rotation of said object of detection, and said calibration amount.

2. The image processing method according to claim 1, wherein said calibration amount is retained for each of a plurality of different angles.

3. The image processing method according to claim 1 or 2, wherein in said pattern matching that is performed on said image of said object of detection, said at least two reference points are included in a single image frame.

4. The image processing method according to claim 1 or 2, said method further comprising a step of calculating working processing points in said object of detection by way of using reference points in said object of detection as a reference.

5. The image processing method according to claim 3, said method further comprising a step of calculating working processing points in said object of detection by way of using reference points in said object of detection as a reference.

6. The image processing method according to claim 3, wherein working processing points that are present outside said image frame in said object of detection are calculated.

7. An image processing device comprising:
    a theoretical value calculating means which calculates a theoretical value of a position of a reference point in a rotated image which is obtained by rotating a reference image that contains said reference point by a specified angle;
    a trial processing means which detects measured value of a position of said reference point by performing pattern matching on said rotated image;
    a calibration amount retention means which retains a difference between said theoretical value and said measured value as a calibration amount that corresponds to said angle of rotation;
    an object detection means which detects measured values of positions of at least two reference points in an object of detection by performing pattern matching on an image of said object of detection;
    an object rotation angle calculating means which calculates an angle of rotation of said object of detection with respect to said reference image on a basis of said measured values of said positions of said at least two reference points that have been detected; and
    a calibration processing means which calculates accurate positions of said reference points in said object of detection on a basis of said measured values of said reference points in said object of detection, said angle of rotation of said object of detection, and said calibration amount.

8. A bonding apparatus including an image processing device that is comprised of:
    a theoretical value calculating means which calculates a theoretical value of a position of a reference point in a rotated image which is obtained by rotating a reference image that contains said reference point by a specified angle;
    a trial processing means which detects measured value of a position of said reference point by performing pattern matching on said rotated image;
    a calibration amount retention means which retains a difference between said theoretical value and said measured value as a calibration amount that corresponds to said angle of rotation;
    an object detection means which detects measured values of positions of at least two reference points in an object of detection by performing pattern matching on an image of said object of detection;
    an object rotation angle calculating means which calculates an angle of rotation of said object of detection with respect to said reference image on a basis of said measured values of said positions of said at least two reference points that have been detected; and
    a calibration processing means which calculates accurate positions of said reference points in said object of detection on a basis of said measured values of said reference points in said object of detection, said angle of rotation of said object of detection, and said calibration amount.

* * * * *